(12) United States Patent
Wood

(10) Patent No.: US 6,522,452 B2
(45) Date of Patent: Feb. 18, 2003

(54) LATCHABLE MICROELECTROMECHANICAL STRUCTURES USING NON-NEWTONIAN FLUIDS, AND METHODS OF OPERATING SAME

(75) Inventor: Robert L. Wood, Cary, NC (US)

(73) Assignee: JDS Uniphase Corporation, San Jose, CA (US)

( * ) Notice: Subject to any disclaimer, the term of this patent is extended or adjusted under 35 U.S.C. 154(b) by 97 days.

(21) Appl. No.: 09/842,602

(22) Filed: Apr. 26, 2001

(65) Prior Publication Data

US 2002/0158547 A1 Oct. 31, 2002

(51) Int. Cl.[7] .................. G02B 26/00; G02B 26/08; G02B 26/02
(52) U.S. Cl. .................. 359/290; 359/221; 359/224; 359/228; 359/292; 359/298
(58) Field of Search .................. 359/290, 291, 359/298, 871, 872, 321, 322, 323, 245, 257, 221, 224, 292, 228; 310/306, 307

(56) References Cited

U.S. PATENT DOCUMENTS

| | | | |
|---|---|---|---|
| 5,909,078 A | 6/1999 | Wood et al. ............... 310/307 |
| 5,955,817 A | 9/1999 | Dhuler et al. ............... 310/307 |
| 5,962,949 A | 10/1999 | Dhuler et al. ............... 310/307 |
| 5,971,503 A | * 10/1999 | Joyce et al. ............... 303/191 |
| 5,994,816 A | 11/1999 | Dhuler et al. ............... 310/307 |
| 6,023,121 A | 2/2000 | Dhuler et al. ............... 310/307 |
| 6,138,621 A | * 10/2000 | Albanello et al. ........ 123/90.12 |
| 6,164,783 A | * 12/2000 | Peterson ............... 359/603 |
| 6,376,971 B1 | * 4/2002 | Perline et al. ............... 310/363 |
| 6,389,189 B1 | * 5/2002 | Edwards et al. ............... 385/17 |
| 6,404,942 B1 | * 6/2002 | Edwards et al. ............... 385/17 |
| 2001/0024556 A1 | * 9/2001 | Beguin et al. ............... 385/125 |

* cited by examiner

Primary Examiner—Georgia Epps
Assistant Examiner—Jack Dinh
(74) Attorney, Agent, or Firm—Myers, Bigel, Sibley & Sajovec

(57) ABSTRACT

Mounting systems for micro-electromechanical system (MEMS) structures are provided including a non-Newtonian fluid having a threshold viscosity that is positioned between a MEMS base member and the MEMS structure so as to position the MEMS structure relative to the base member. A MEMS actuator is coupled to the MEMS structure. The MEMS actuator is positioned to cause movement of the MEMS structure relative to the MEMS base member by generating a force sufficient to exceed the threshold viscosity of the non-Newtonian fluid when the MEMS actuator is actuated. The MEMS structure may be a MEMS mirror positioned for pivotal movement about a bearing member to control tilt of the MEMS mirror.

38 Claims, 8 Drawing Sheets

LATCHABLE MICROELECTROMECHANICAL STRUCTURES USING NON-NEWTONIAN FLUIDS, AND METHODS OF OPERATING SAME

FIELD OF THE INVENTION

This invention relates to electromechanical systems, and more particularly to micro-electromechanical systems (MEMS) and operating methods therefor.

BACKGROUND OF THE INVENTION

Micro-electromechanical systems (MEMS) have been developed as alternatives to conventional electromechanical devices, such as relays, actuators, valves and sensors. MEMS devices are potentially low-cost devices, due to the use of micro-electronic fabrication techniques. New functionality also may be provided, because MEMS devices can be much smaller than conventional electromechanical devices.

Many applications of MEMS technology use MEMS actuators. These actuators may use, for example, one or more beams that are fixed at one or both ends. These actuators may be actuated electrostatically, magnetically, thermally and/or using other forms of energy.

A major breakthrough in MEMS actuators is described in U.S. Pat. No. 5,909,078 entitled Thermal Arched Beam Micro-electromechanical Actuators. Disclosed is a family of thermal arched beam micro-electromechanical actuators that include an arched beam which extends between spaced apart supports on a micro-electronic substrate. The arched beam expands upon application of heat thereto. Thermal arched beam micro-electromechanical devices and associated fabrication methods also are described in U.S. Pat. No. 5,955,817 to Dhuler et al. entitled Thermal Arched Beam Micro-electromechanical Switching Array; U.S. Pat. No. 5,962,949 to Dhuler et al. entitled Micro-electromechanical Positioning Apparatus; U.S. Pat. No. 5,994,816 to Dhuler et al. entitled Thermal Arched Beam Micro-electromechanical Devices and Associated Fabrication Methods; U.S. Pat. No. 6,023,121 to Dhuler et al. entitled Thermal Arched Beam Micro-electromechanical Structure.

MEMS actuators may be utilized in a variety of optical components. For example, various circuits utilize MEMS mirrors which may utilize actuators in order to adjust the tilt of the mirrors. Such tiltable MEMS mirrors may be used, for example, in optical transmission circuits. MEMS mirrors typically are also provided with suspension springs which introduce mechanical resistance during movement of the mirrors to adjust tilt. In addition, damping means, such as squeeze film (air) damping or active servo control, are generally provided to aid in damping shock or vibration of the mirrors. Such approaches typically are only applicable for frequencies below the harmonic frequency of the mirror system.

Unfortunately, conventional MEMS actuators may require continuous application of an electrostatic potential, a magnetic field, electric current and/or other energy to the MEMS actuator in order to maintain the actuator in a set or actuated position. This may consume excessive power. Moreover, an interruption of power may cause the actuator to reset.

It is known to provide notches, dimples, protrusions, indentations and/or other mechanical features in MEMS actuators that can allow the actuator to be mechanically set in a given position. See for example, the above-cited U.S. Pat. No. 5,955,817 and 5,994,816. Unfortunately, these mechanical features may be subject to wear. Moreover, mechanical locking that relies on friction may be difficult to obtain reliably due to the small dimensions of MEMS actuators and the uncertain values of static and dynamic friction in MEMS devices. Thus, notwithstanding conventional micro-electromechanical devices, there continues to be a need for lockable micro-electromechanical actuators that need not consume power when locked and need not rely on mechanical friction for locking.

SUMMARY OF THE INVENTION

Mounting systems for micro-electromechanical system (MEMS) structures according to embodiments of the invention include a non-Newtonian fluid having a threshold viscosity that is positioned between a MEMS base member and the MEMS structure so as to position the MEMS structure relative to the base member. A MEMS actuator is coupled to the MEMS structure. The MEMS actuator is positioned to cause movement of the MEMS structure relative to the MEMS base member by generating a force sufficient to exceed the threshold viscosity of the non-Newtonian fluid when the MEMS actuator is activated.

The non-Newtonian fluid may be coupled to the MEMS structure by fluid tension. The non-Newtonian fluid may have an associated viscosity, when the MEMS actuator is not activated, selected to latch the MEMS structure in a desired position and dampen motion of the MEMS structure. The non-Newtonian fluid may be a magnetorheological (MR) fluid, an electrorheological (ER) fluid or a grease.

In further embodiments of the present invention, the MEMS actuator is an electromagnetic actuator. The electromagnetic actuator includes a coil member connected to either the MEMS structure or the MEMS base member and a passive member connected to the other of the MEMS structure and the MEMS base member. The passive member is positioned adjacent the coil member so as to be either attracted to or repelled from the coil member when the coil member is activated by passing an electrical signal therethrough. The passive member may be a magnetic plate connected to the MEMS structure and the coil member may be a planar coil fabricated on the MEMS base member.

In other embodiments of the present invention, a bearing member is positioned between the MEMS base member and the MEMS structure that movably couples the MEMS structure to the MEMS base member. The non-Newtonian fluid suspends the MEMS structure relative to the MEMS base member. The bearing member may pivotally couple the MEMS structure to the base member and the actuator may be positioned to cause pivotal movement of the MEMS structure about the bearing member when the actuator is activated. The non-Newtonian fluid may be located at a position displaced from the bearing member and the actuator may be positioned on the same side of the bearing member as the non-Newtonian fluid. The actuator may be positioned at substantially the same location between the MEMS structure and the base member as the non-Newtonian fluid.

In yet further embodiments of the present invention, the non-Newtonian fluid is a magnetorheological (MR) fluid and the actuator is an electromagnetic actuator. The electromagnetic actuator includes a coil member connected to either the MEMS structure or the MEMS base member and a passive member connected to the other of the MEMS structure and the MEMS base member. The passive member may be positioned adjacent the coil member so as to be either attracted to or repelled from the coil member when the coil member is activated by passing an electrical signal therethrough. The coil member may be further configured to generate trim fields that buck a magnetic field extending into the MR fluid so that the MR fluid will convert to a Newtonian flow state. The coil member may then further rotate the MEMS structure about the bearing member when the coil member is activated. The passive member may be a magnetic member that generates the magnetic field extending into the MR fluid. Alternatively, an external magnet may be positioned adjacent the suspension system to generate the magnetic field extending into the MR fluid.

In other embodiments of the present invention, an electrical connection is provided to the MEMS structure. The non-Newtonian fluid in such embodiments is a electrorheological (ER) fluid and the actuator is an electromagnetic actuator. The electromagnetic actuator includes a coil member connected to either the MEMS structure and the MEMS base member and a passive member connected to the other of the MEMS structure and the MEMS base member. The passive member is positioned adjacent the coil member so as to be either attracted to or repelled from the coil member when the coil member is activated by passing an electrical signal including a magnetic field signal, that provides a magnetic field that results in the magnetic member being either attracted to or repelled from the coil member, and an electrical field signal thereto. The electrical field signal provides an electrical field between the MEMS structure and the coil member using the electrical connection to the MEMS structure, the electrical field maintaining the non-Newtonian fluid in a non-Newtonian state when the electrical field signal is activated.

In further embodiments of the present invention, a second non-Newtonian fluid is positioned between the base member and the MEMS structure at a second position displaced from the bearing member in a direction opposite from the position of the first non-Newtonian fluid. A second actuator is positioned on the same side of the bearing member as the second non-Newtonian fluid so as to cause pivotal movement of the MEMS structure about the bearing member by generating a force sufficient to exceed the threshold viscosity of the second non-Newtonian fluid when the second actuator is activated.

In other embodiments of the present invention, a micro-electromechanical system (MEMS) mirror apparatus is provided including a MEMS substrate and a MEMS mirror adjacent the substrate. A joint is positioned between the substrate and the MEMS mirror that pivotally couples the MEMS mirror and the substrate. A non-Newtonian fluid having a threshold viscosity is positioned between the substrate and the MEMS mirror that suspends the MEMS mirror relative to the substrate. A MEMS force generator is coupled to the MEMS mirror at a position displaced from the joint that is configured to generate a force sufficient to overcome the threshold viscosity of the non-Newtonian fluid so as to cause pivotal movement of the MEMS mirror about the joint.

The MEMS mirror may be suspended from the MEMS substrate without the use of suspension springs. The joint may be a solder bump on the MEMS substrate and the MEMS mirror may include an etch pit on a surface thereof configured to rotatably receive the solder bump. The threshold viscosity of the non-Newtonian fluid may be from about 1 centipoise (cP) to about 1000 cP, and may further be from about 10 cP to about 100 cP.

In yet other embodiments of the present invention, methods are provided for controlling a position of a MEMS structure suspended from a MEMS substrate by a non-Newtonian fluid for pivotal movement about a joint. The method includes estimating a position of the MEMS structure and determining a desired movement direction based on the estimated position and a desired position. A MEMS force generator is activated to generate a force in a desired direction and having a magnitude sufficient to overcome a threshold viscosity of the non-Newtonian fluid. The desired direction corresponds to the determined desired movement direction. The MEMS force generator is deactivated when the position of the MEMS structure corresponds to the desired position.

In further method embodiments of the present invention, the non-Newtonian fluid is an electrorheological (ER) fluid and the MEMS force generator includes a passive member and a coil member connected to respective ones of the MEMS structure and the MEMS substrate and positioned substantially at a same location between the MEMS structure and the MEMS substrate as the non-Newtonian fluid. In such embodiments, activating the MEMS force generator includes deactivating an electrical field between the coil member and the MEMS structure so that the non-Newtonian fluid will convert to a Newtonian flow state. A magnetic field between the coil member and the passive member is activated to generate the force in the desired direction to pivot the MEMS structure about the joint while the electrical field is deactivated. The electrical field is activated to return the non-Newtonian fluid to a non-Newtonian flow state after the MEMS structure has pivoted to the desired position. The magnetic field is deactivated after the MEMS structure has pivoted to the desired position.

DETAILED DESCRIPTION OF PREFERRED EMBODIMENTS

Figure 1:
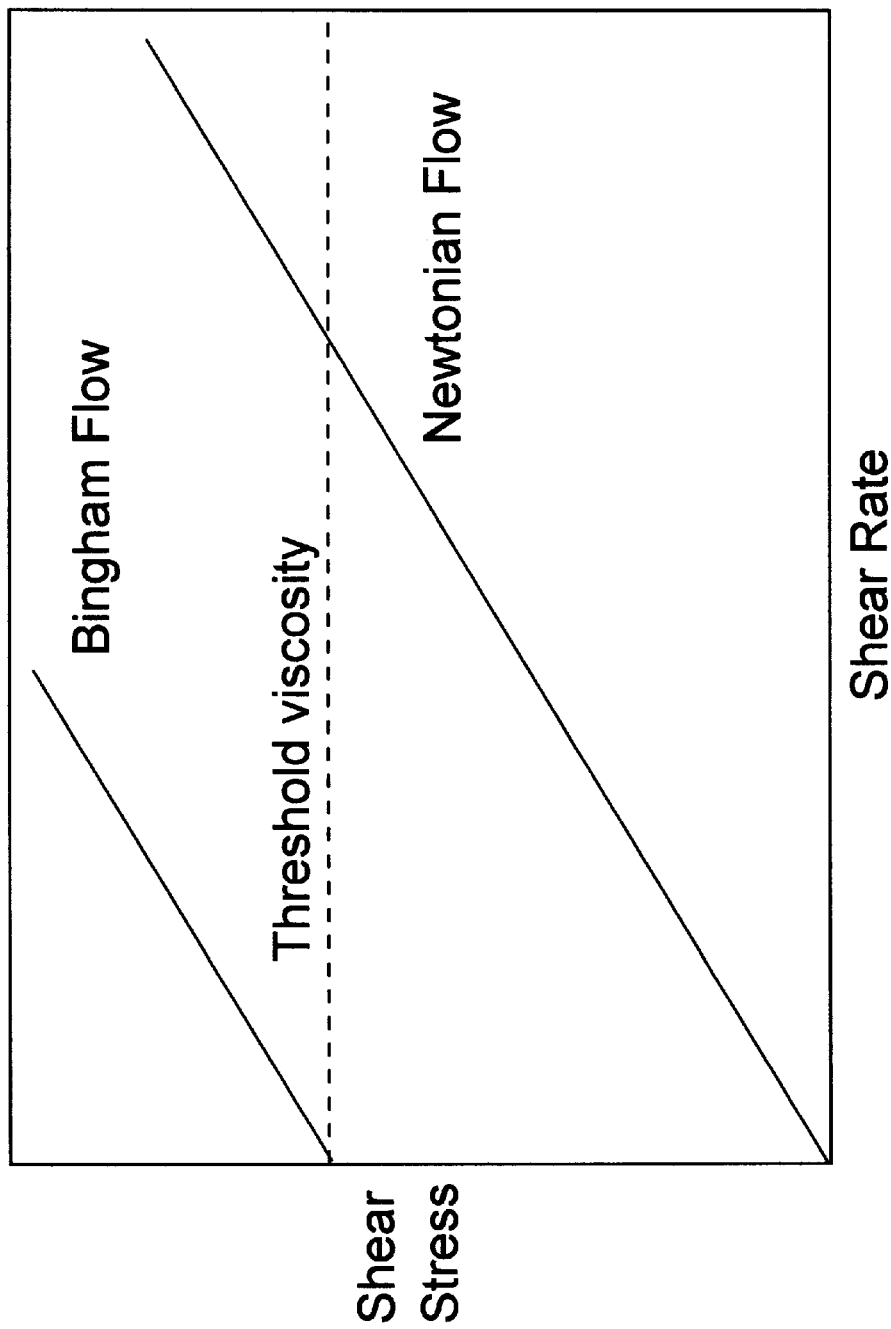
FIG. 1 is a graphical illustration of fluid shear stress versus shear rate for a non-Newtonian fluid.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on", "connected to" or "coupled to" another element, it can be directly on, directly connected to or directly coupled to the other element, or intervening elements also may be present. In contrast, when an element is referred to as being "directly on", "directly connected to" or "directly coupled to" another element, there are no intervening elements present.

The present invention generally relates in various embodiments to uses of a non-Newtonian fluid to suspend, actuate, dampen and/or latch MEMS structures, such as MEMS mirrors. For non-Newtonian fluids, the relationship between shear rate and shear stress is nonlinear. In other words, the viscosity of non-Newtonian fluids does not remain constant but varies as a function of shear rate. As used herein, references to "non-Newtonian" fluids generally refers to fluids having such nonlinear relations sufficient to provide a latching effect in positioning a MEMS structure in that an application of external force is required to cause movement of the fluids and, thereby, movement of the supported MEMS structure. Preferably, the non-Newtonian fluids have an associated threshold viscosity which may be defined by a breakpoint or a transition region in the material's shear rate versus shear stress characteristics at a threshold viscosity level sufficient to allow the non-Newtonian fluid to position the supported structure in a desired location when the actuator used for repositioning is not activated. The threshold viscosity in various embodiments is from about 1 cP to about 1000 cP and may be from about 10 cP to about 100 cP.

To further understanding of the present invention as described herein, a general discussion will first be provided related to a particular class of non-Newtonian fluids, which may be described as Bingham fluids. Bingham fluids typically exhibit very large viscosities at low shear rates and resemble solids or semi-solids at rest. As illustrated in FIG. 1, above a particular shear stress, which varies according to the fluid chosen, flow will occur and the fluid then behaves according to Newtonian fluid dynamics. When the shear stress falls below the threshold value, the fluid again takes on the characteristics of a solid or semi-solid. A familiar every day example of a Bingham fluid is butter.

Figure 2:
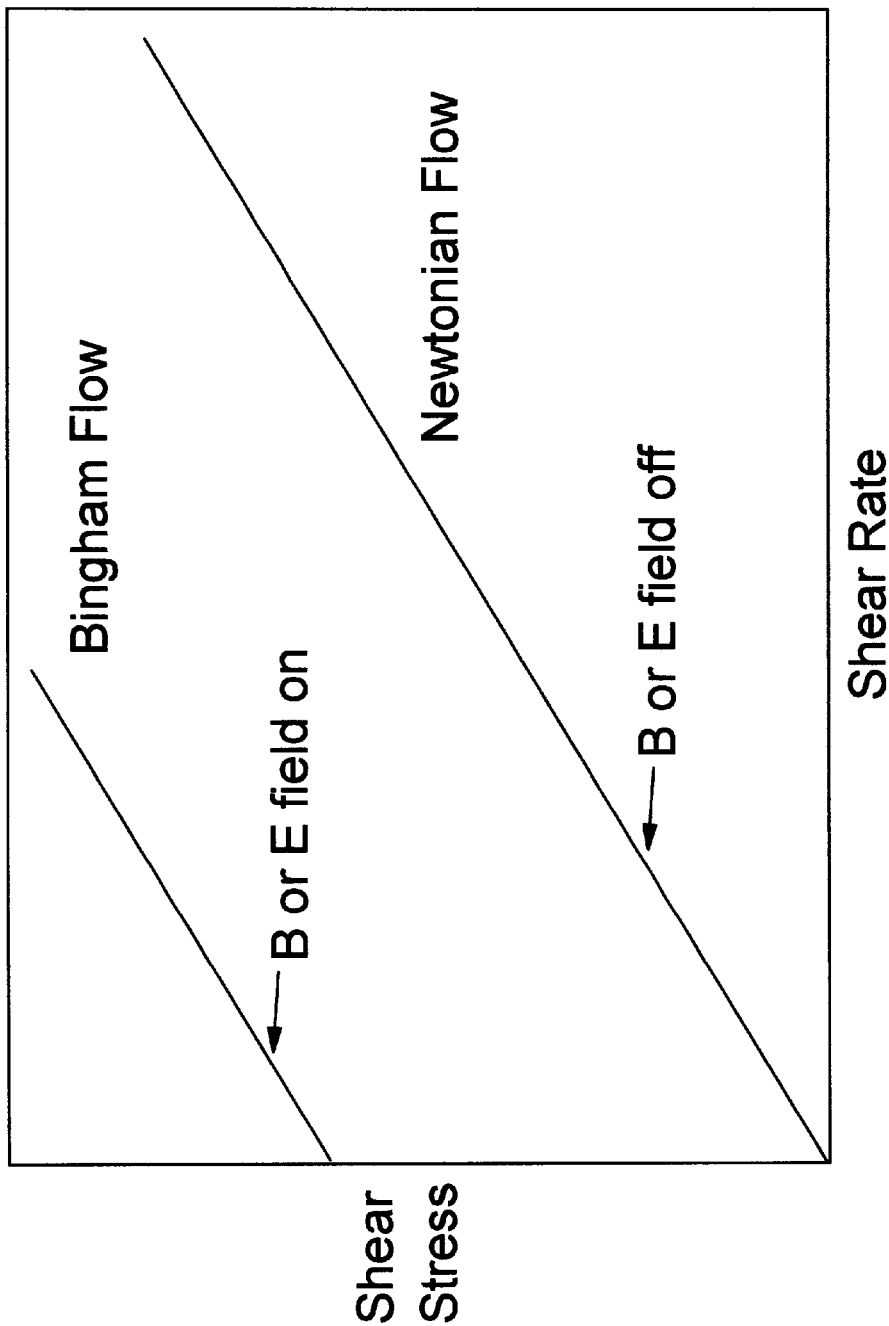
FIG. 2 is a graphical illustration of fluid shear stress versus shear rate for a magnetorheological (MR) non-Newtonian fluid and an electrorheological (ER) non-Newtonian fluid.

A special class of Bingham type non-Newtonian fluids is illustrated in FIG. 2. The Bingham fluids illustrated in FIG. 2 can be prepared by suspension of submicron particles in a carrier liquid. In the case of suspended particles that are magnetic, the fluid is generally called a magnetorheological (MR) fluid. In the case of suspended dielectric particles, the fluid is generally referred to as an electrorheological (ER) fluid. When subjected to an applied magnetic field, an MR fluid will generally behave as a Bingham fluid. Similarly, in an electrical field, an ER fluid generally becomes a Bingham type fluid. In both MR and ER fluids, when the field is removed, they typically behave as Newtonian fluids, accompanied by a significant reduction in viscosity. Both of these fluid types are generally indefinitely reversible.

Figure 3:
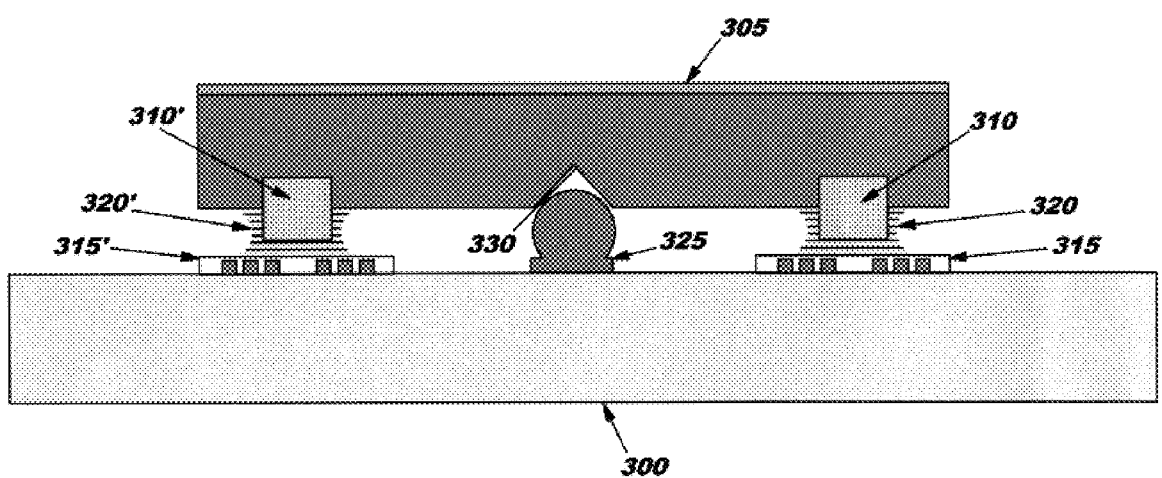
FIG. 3 is a side cross-sectional view of a mounting system for a micro-electromechanical system (MEMS) structure according to embodiments of the present invention.
Figure 4:
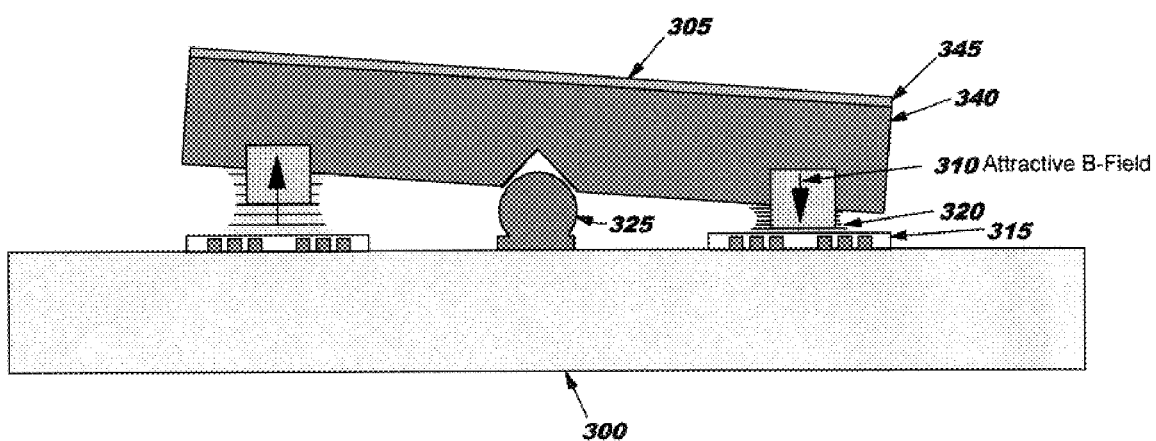
FIG. 4 is a side cross-sectional view of the mounting system of FIG. 3 with the actuators activated.

The present invention will now be further described with reference to the embodiments of a micro-electromechanical system (MEMS) structure including a mounting system, such as a suspension system, in accordance with the present invention illustrated in FIGS. 3 and 4. As illustrated in FIG. 3, the actuator force mechanism is not activated while it is activated as shown in FIG. 4. As used herein "activated" refers to the actuated stated of an actuator which may be provided either by application of an energy signal, such as with a coil system as illustrated in FIG. 4, or by removal of an energy signal, such as with a spring type system with a normally actuated configuration. Deactivated refers to the non-actuated state of the actuator.

Referring now to FIGS. 3 and 4, a suspension system for a MEMS stricture 305, such as the MEMS mirror 305, is illustrated. The suspension system includes a MEMS base member 300, illustrated as a MEMS substrate 300 in FIGS. 3 and 4. A non-Newtonian fluid 320, 320' is positioned between the base member 300 and the MEMS mirror 305 so as to position the MEMS mirror relative to the base member 300. As shown in the embodiments of FIGS. 3 and 4, the non-Newtonian fluid 320 is located at a position displaced from a bearing member 325 and suspends the MEMS mirror 305 relative to the MEMS based member 300 by controlling the angle of pivot of the MEMS mirror 305 about the bearing member 325, shown as a joint 325 in the figures. More particularly, bearing member 325 is illustrated in FIGS. 3 and 4 as a solder bump on the substrate 300. However, it can be any other kind of pivot such as a needle pivot or a flexible link. The embodiments of FIGS. 3 and 4 further include a second non-Newtonian fluid 320' positioned between the substrate 300 and the MEMS structure 305 at a second position displaced from the bearing member 325 in a direction opposite from the position of the first non-Newtonian fluid 320.

A MEMS actuator or other MEMS force generator is coupled between the MEMS mirror 305 and the MEMS base member 300 which actuator is positioned to cause movement of the MEMS mirror 305 relative to the MEMS base member 300 by generating a force sufficient to exceed a threshold viscosity of the non-Newtonian fluid 320, 320' when the MEMS actuator is activated. As shown in FIGS. 3 and 4, two MEMS actuators are provided including first and second magnetic plate members 310, 310' and associated first and second planar coils 315, 315'. However, other actuators may be used such as electrostatic plates, Lorenz coils, piezoelectric actuators, such as piezoelectric beams or diaphragms, or other actuators. The respective actuator members for the illustrated embodiments of FIGS. 3 and 4 arc positioned at substantially a same location between the MEMS structure 305 and the MEMS base member 300 as the non-Newtonian fluid 320, 320', but they need not be.

As discussed above, the non-Newtonian fluid may comprise a Bingham fluid, such as vacuum grease, a magnetorheological (MR) fluid or an electrorheological (ER) fluid. As shown in FIGS. 3 and 4, the non-Newtonian fluid is coupled to the MEMS mirror 305 by fluid tension and has an associated viscosity which varies in a non-Newtonian manner when subjected to a shear force. Alternatively, the non-Newtonian fluid may be included in a container coupled to the MEMS mirror 305. Note that the non-Newtonian characteristics of the fluids as described herein arc based on a shear force characteristic and not a thermal characteristic, such as may be encountered with thermoplastic materials, such as waxes. Such an approach is described in U.S. patent application Ser. No. 09/543,540 to Wood filed Apr. 5, 2000 and entitled Lockable Micro-electromechanical Actuators Using Thermoplastic Material and Methods of Operating Same. A thermoplastic material, such as wax, is disclosed which may be heated to a liquid state to allow movement and cooled to a solid state to provide a latching mechanism for an actuator. However, the use of a thermoplastic typically uses means for heating the thermoplastic material to transition into and out of a latched state. This thermal component of operations may use, for example, a heater and may use an undesirable cooling time before the latched state is achieved after moving the actuator while the thermoplastic material is at an elevated temperature.

Various materials which may exhibit latching characteristics through thermal transitions, such as wax, may also, at a particular intermediate temperature range between liquid and solid states, demonstrate a non-Newtonian fluid characteristic suitable for use with the present invention. More particularly, the selected non-Newtonian material in accordance with embodiments of the present invention preferably has an associated viscosity when the MEMS actuator is not activated which is selected to latch the MEMS structure 305 in a desired position and dampen motion of the MEMS structure under normal vibratory or other environmental conditions. However, it is further to be understood that such materials may have associated creep characteristics which may require periodic refreshing by active positioning of a supported structure to insure that such position creep does not affect performance of the MEMS structure in its desired application.

The fluid tension between the MEMS mirror 305 and the non-Newtonian fluid 320, 320' may be selected to provide support against inertial and other environmental forces where the surface tension characteristic is assumed sufficiently large compared to the inertial mass of the MEMS mirror 305 and the typically encountered environmental disturbances. Thus, a MEMS structure such as a MEMS mirror may be suspended from a MEMS substrate without the use of suspension springs to allow rotation of the mirror substantially without the type of mechanical resistance that would otherwise be met using such suspension springs.

Referring now to further details of the embodiments illustrated in FIGS. 3 and 4, the solder bump 325 fits into an etch pit 330 formed, for example, by anisotropic etching. Other suitable bearings include, but are not limited to, pins, needles, ball and socket, flexible linkage or other bearing. The MEMS structure shown in the figures is a MEMS mirror formed of a silicon die 340 coated with reflective gold layer 345. Other mirror structures and/or other movable MEMS structures suitable for use with the present invention include, but are not limited to, plates, comb drives, beams, switches, diaphragms and other structures. The etch pit 330 may be etched into the silicon die 340.

The actuator may be provided by planar coils 315, 315' also fabricated on the substrate 300 in positions selected to operate in cooperation with the magnetic plates 310, 310' which may be formed by depositing on the backside of the MEMS mirror 305 so as to tilt the mirror to the desired degree and direction. While the provided positioning is illustrated in the figures for systems having two degrees of freedom positioning, it is to be understood that more or less degrees of freedom in positioning may also be provided in accordance with the present invention. While the non-electrically activated or passive members 310, 310' of the actuators are described herein as magnetic plates, they may be formed of a non-magnetic material which is nonetheless attracted by magnetic fields generated by the planar coils 315, 315'. Furthermore, while in the illustrated embodiments of FIGS. 3 and 4 the magnetic members 310, 310' are connected to the MEMS mirror 305 and the planer coils 315, 315' are connected to the substrate 300, one or more of these connections may be reversed so long as the configuration provides a coupling for applying a force to the MEMS mirror 305 so as to allow position control of the MEMS mirror 305. Furthermore, as shown with reference to the embodiments illustrated in FIG. 4, the two respective actuators may be cooperatively used by positioning them on opposite sides of the solder bump 325 and presenting an attractive magnetic field on one and a repulsive magnetic field on the other so that both operate to tilt the MEMS mirror 305 in the desired direction. Alternatively, only a single actuator may be used or multiple actuators which are asymmetrically positioned may be used.

Regardless of the particular configuration of the MEMS actuator, with sufficient field applied, the non-Newtonian fluid's threshold shear stress may be overcome, thereby permitting flow of the fluid and movement of the MEMS mirror 305 pivotally about the solder bump 325. When the electrical signal to the actuator is turned off, the non-Newtonian fluid substantially instantaneously "freezes" to its threshold viscosity. If long term creep of the mirror is a problem in a particular operating environment for a given non-Newtonian fluid selection, such creep may be controlled by periodically, for example, once every few seconds to once every few minutes, refreshing the position of the MEMS mirror 305. The refresh rate may further be adapted responsive to changes in the creep rate. The relatively high viscosity of the non-Newtonian fluid below its threshold shear stress may be utilized both while latching and dampening of motion of the MEMS mirrors 305 between refresh intervals so as to provide a suspension system for the MEMS mirror 305.

In particular embodiments of the present invention, the non-Newtonian fluid 320, 325 may be a vacuum grease. A vacuum grease may be advantageous as such materials typically have been engineered for use in vacuum environments and, hence, do not out-gas and may be suitable for use in a sealed package as a result. Such vacuum greases are typically also engineered to have a flat viscosity versus temperature profile which may be advantageous in various applications of the present invention so as to make the system's suspension characteristics substantially independent of environmental temperature conditions.

Figure 5:
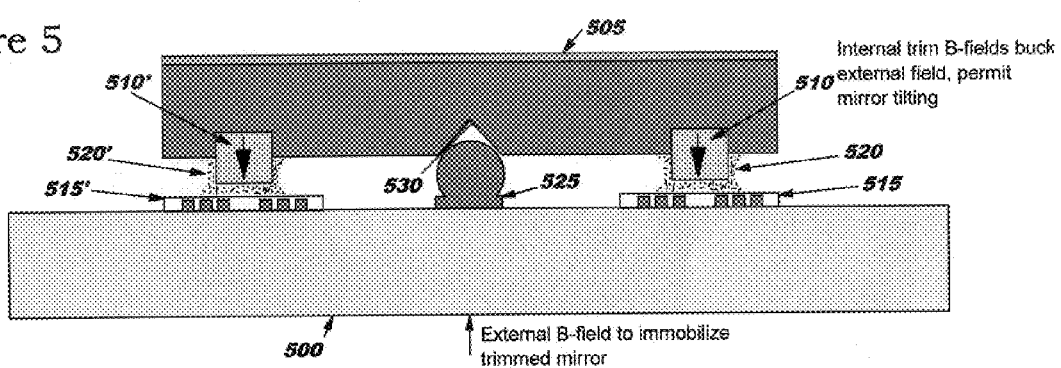
FIG. 5 is a side cross-sectional view of a mounting system for a micro-electromechanical system (MEMS) structure using a magnetorheological (MR) non-Newtonian fluid according to other embodiments of the present invention.

Referring now to FIG. 5, a suspension system for a MEMS structure, such as a MEMS mirror 505, according to embodiments of the present invention utilizing an MR fluid will be further described. As shown for the MEMS mirror 505 in FIG. 5, a base member or MEMS substrate 500 includes a solder bump 525 which fits in the etch pit 530 of the silicon dye layer of the MEMS mirror 505. First and second MR fluids 520, 520' are positioned between the MEMS mirror 505 and the MEMS substrate 500 to position the MEMS mirror 505 which is pivotally coupled to and supported by the solder bump 525. For the embodiments shown in FIG. 5, the passive members 520, 520' are magnetic members and the MR fluid 520, 520' is positioned so that the magnetic fields produced by the magnetic members 510, 510' extend into the MR fluid 520, 520' and may convert the MR fluid 520, 520' into its non-Newtonian state. Alternatively, or additionally, a global magnetic field may be applied which is produced, for example, by a permanent magnet external to the MEMS structure. In such embodiments, the passive members 510, 510' need not be magnetic members and further need not be positioned so as to extend their magnetic fields into the MR fluid 520, 520'.

Trim fields produced by the substrate coils 515, 515' may be used to buck the magnetic field in the MR fluid 520, 520' so as to convert the MR fluid 520, 520' to its -Newtonian flow state so as to allow rotation of the MEMS structure about the solder bump 525 when the planer coil members 515, 515' are activated. Thus, the bucking fields may be utilized to both change the fluid flow state of the MR fluids and to trim the MEMS mirror 505 to a desired tilt angle.

Once the fields are removed from the coils 515, 515', the external magnet, or the magnetic field produced by the members 510, 510', converts the MR fluid 520, 520' once again to its non-Newtonian state so as to latch and dampen the MEMS mirror 505 in the desired position. The embodiments utilizing MR fluid as illustrated in FIG. 5 may provide for faster adjustment of the position of the MEMS mirror 505 due to the potentially significantly lowered viscosity of the MR fluid 520, 520' during switching transitions.

Figure 6:
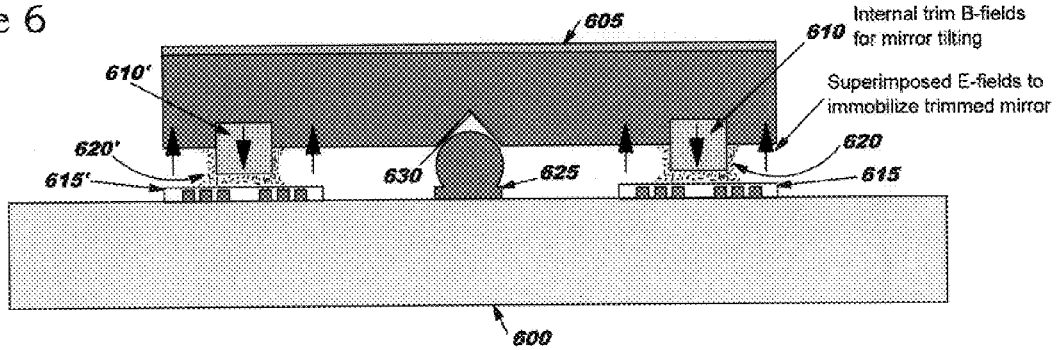
FIG. 6 is a side cross-sectional view of a mounting system for a micro-electromechanical system (MEMS) structure using a electrorheological (ER) non-Newtonian fluid according to further embodiments of the present invention.

Further embodiments of the present invention utilizing ER fluids as the non-Newtonian fluid will now be further described with reference to the illustration of FIG. 6. As shown in FIG. 6, a MEMS structure such as the MEMS mirror 605 is pivotally mounted on a solder bump 625 through an etch pit 630. The solder bump 625 is positioned on the MEMS substrate 600. As shown in FIG. 6, an ER fluid is provided at two positions on opposite sides of the solder bump 625. The ER fluid 620, 620' is positioned between the MEMS mirror 605 and the MEMS substrate 600 in substantially the same position as the actuators. The actuators include passive members 610, 610' and coils 615, 615'.

More particularly, for the embodiments shown in FIG. 6, the coil members 615, 615' are positioned relative to the ER fluids 620, 620' so as to cooperate with the MEMS mirror 605 to provide an electrical field between the MEMS mirror 605 and the coil members 615, 615' to maintain the ER fluid in a Bingham state when an electrical field signal is applied to the coil members 615, 615'. A magnetic field signal may further be applied to the coil members 615, 615' to provide a magnetic field to either attract or repel respective ones of the magnetic members 610, 610' to or from the coil members 615, 615'.

The embodiments in FIG. 6 include an electrical connection to the MEMS mirror 605 to allow the MEMS mirror 605 itself to complete the E-field circuit. The electrical connection may be provided, for example, through the solder bump 625. Furthermore, the electrical field signal to the coil members 615, 615' may be superimposed on coil current as will be understood by those of ordinary skill in the art The electrical field signal, thus, maintains the ER fluid 620, 620' in its Bingham state so as to suspend the MEMS mirror 605 in the desired position. Removal of the E-field and activation of the magnetic field from the coil members 615, 615' may then be used to adjust the MEMS mirror 605 to a desired position or tilt angle. Following movement, the E-field may again be turned on to latch the MEMS mirror 605 in the desired position after which the magnetic field may be turned off to allow the MEMS mirror 605 to remain latched and dampened in the desired position.

Figure 7:
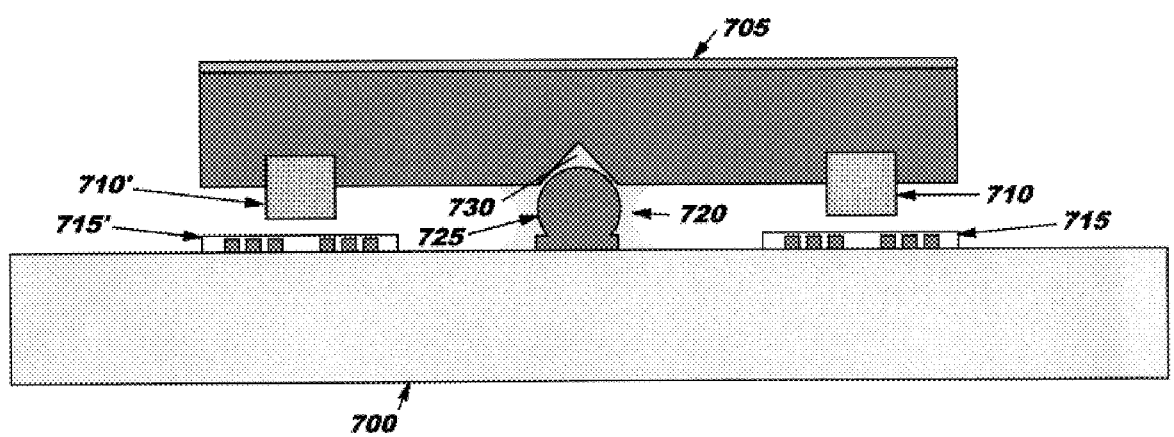
FIG. 7 is a side cross-sectional view of a mounting system for a micro-electromechanical system (MEMS) structure according to other embodiments of the present invention.

Alternative embodiments of the present invention are illustrated in FIG. 7. For the embodiments shown in FIG. 7, that only a single position of non-Newtonian fluid 720 is provided between the MEMS substrate 700 and the MEMS structure 705. Further note that the non-Newtonian fluid 720 is positioned at substantially the same position as the solder bump 725 and the etch pit 730. Actuators are also illustrated in FIG. 7 to each side of the solder bump 725 which include respective passive members 710, 710', which may be magnetic members, and coil members 715, 715'. The alternative embodiments of FIG. 7 may advantageously provide for simpler construction of the MEMS suspension by only requiring placement of the non-Newtonian fluid in a single position and may further utilize the physical structural characteristics in the MEMS substrate 700, introduced during fabrication of the solder bump 725, to facilitate retention of the non-Newtonian fluid 720. The positioning of the actuators displaced from the solder bump 725 may also advantageously allow use of a non-Newtonian fluid with a higher threshold viscosity without requiring a stronger actuator given the leverage effect provided by the displacement between the actuators and the fluid. The features of the embodiments illustrated in FIG. 7 may also be combined with aspects of other embodiments illustrated in FIGS. 3–6.

While in the various embodiments illustrated in FIGS. 3–7, two actuators are provided positioned on opposite sides of the solder bump 325, 425, 525, 625, 725, the present invention is not so limited and may be provided through use of only a single actuator mechanism. Furthermore, the solder bump need not be positioned in a medial portion of the MEMS structure 705 but instead may be positioned on an end thereof or otherwise located within the region between the MEMS structure 705 and the MEMS substrate 700. Finally, while the embodiments shown utilize pivotal motion which may facilitate suspension and movement of the MEMS structures 705, such as MEMS mirrors, which typically require adjustments to tilt, the present invention is not so limited. The MEMS structure 705 may, for example, be supported by the non-Newtonian fluid 720 relative to the MEMS substrate 700 without the inclusion of a solder bump 725 or other type of bearing member or joint. The position adjustments provided by the actuators may further utilize movement between the MEMS structure 705 and the MEMS substrate 700 which is not based upon pivotal movement but based upon linear or other movement mechanism.

Thus, various embodiments of the present invention utilizing non-Newtonian fluids for positioning a MEMS structure relative to a MEMS substrate may beneficially provide for retention of the MEMS structure by surface tension alone so as to impose substantially no mechanical restraint to movement or rotation of the MEMS structure. Furthermore, the non-Newtonian characteristics of the suspension fluid may desirably allow for latching of the MEMS structure in a desired state, thereby reducing the need for continuous power application. However, it is to be understood that periodic adjustments may be performed where creep is encountered. The non-Newtonian fluid in the suspension may further advantageously provide for suitable damping of the MEMS structure's movement when the MEMS structure is in its latched state for devices which may be subject to environmentally induced shock or vibration forces. It is also believed that the assembled approach used to form the structure shown in FIGS. 3–7 may result in relatively high optical fill and yield for MEMS mirror applications of the present invention.

Figure 8:
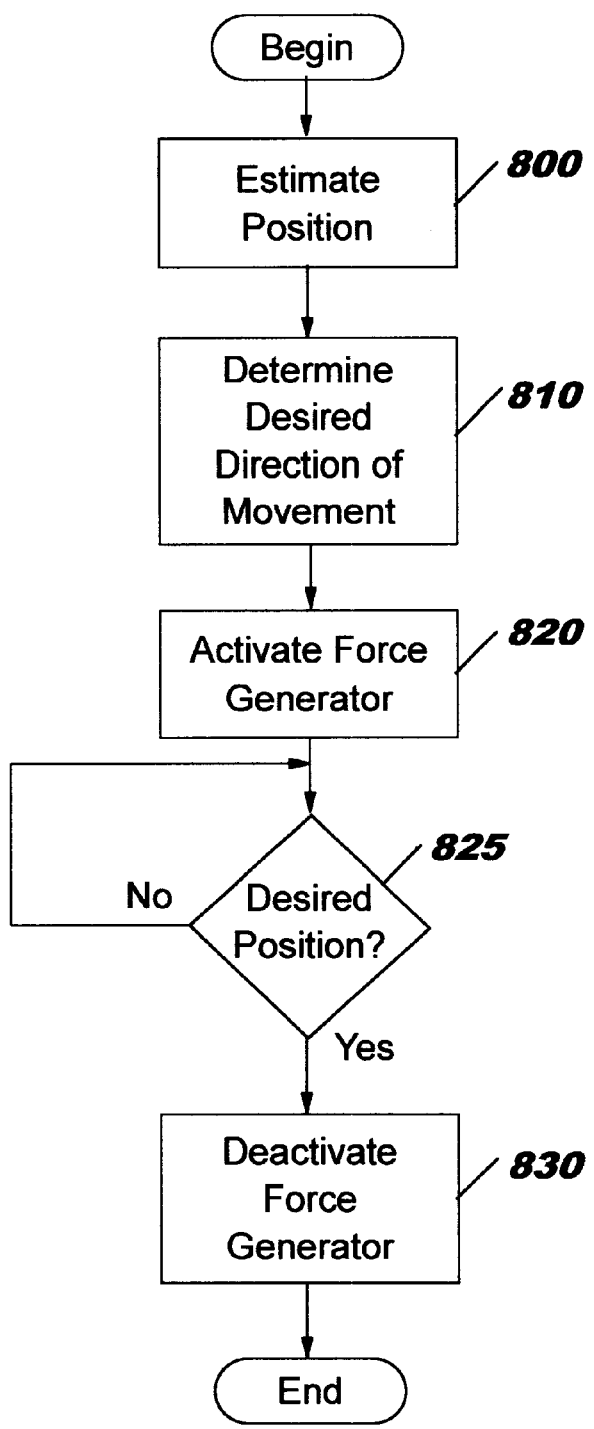
FIG. 8 is a flowchart illustrating operations for controlling tilt of a MEMS structure according to embodiments of the present invention.

Referring now to FIG. 8, operations related to controlling tilt of a MEMS structure, such as a mirror, suspended from a MEMS substrate by a non-Newtonian fluid for pivotal movement about a joint will now be further described according to various embodiments of the present invention. Operations may begin at block 800 by estimating a position (such as a tilt) of the MEMS structure. A desired direction of movement for the MEMS structure may, for example, be determined based on the estimated position and a desired position (block 810). The desired position may be provided, for example, by a control signal received by a controller having input signals and output signals including output signals for controlling the current to coil members 315, 415, 515, 615, 715. A MEMS force generator is activated to generate a force in the desired direction and having a magnitude sufficient to overcome a threshold viscosity characteristic of the non-Newtonian suspension fluid (block 820). Once the desired position (or tilt) is reached (block 825), the MEMS force generator is deactivated so that the structure may be latched at a position corresponding to the desired position (block 830).

Where the non-Newtonian fluid is a MR fluid, it is to be understood that an external magnetic field may be provided extending into the MR fluid or that a magnetic member component of the MEMS force generator may be provided having a permanent magnetic field extending into the MR fluid so as to induce the Bingham flow state in the MR fluid. In such embodiments, operations related to activating the force generator at block 820 may include activating the force generator to generate trim fields from a coil member of the force generator that buck a magnetic field of a magnetic member or external member extending into the non-Newtonian MR fluid to convert the MR fluid to a Newtonian state.

Figure 9:
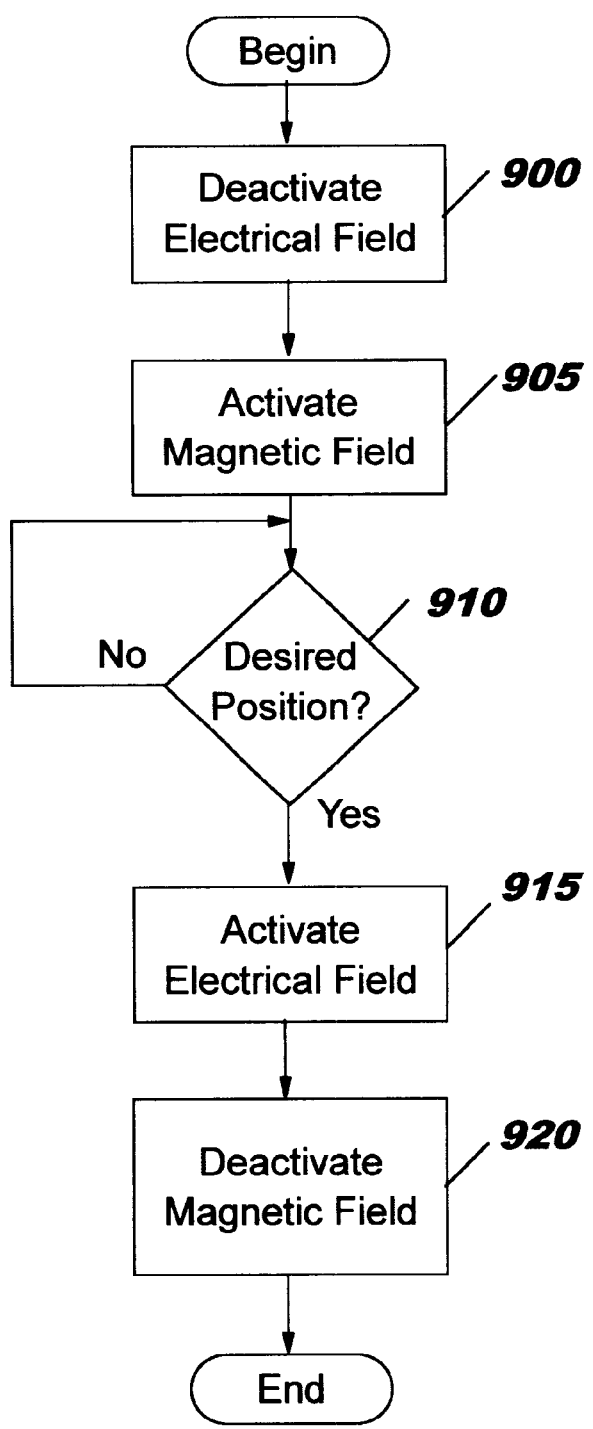
FIG. 9 is a flowchart illustrating operations for activating a MEMS force generator for ER non-Newtonian fluid embodiments of the present invention.

Referring now to the embodiments of the present invention illustrated in FIG. 9, operations related to activating and de-activating the force generator as described in FIG. 8 at blocks 820–830 will be further described for ER suspension fluids with reference to the flowchart illustration. Operations will be described with reference to a MEMS force generator which comprises a passive member and a coil member connected to respective ones of a MEMS structure to be adjusted and a MEMS substrate over which the MEMS structure is positioned. The ER fluid may be positioned substantially at a same location between the MEMS structure and a MEMS substrate as the force generator. Substantially, as used in this context, refers to positioning of sufficient proximity so as to allow an electrical field generated between the coil member and the MEMS structure to activate the Bingham state of the ER fluid.

As illustrated in FIG. 9, the electrical field between the coil member(s) and the MEMS mirror is deactivated so that the ER fluid will convert to a Newtonian flow state (block 900). While the electrical field is deactivated, a magnetic field between the coil member(s) and the passive member(s) is activated to generate a force in a desired direction to pivot the MEMS structure about the joint between the MEMS structure and the MEMS substrate (block 905). Once the desired position (or tilt) is reached (block 910), the electrical field is again activated to return the ER fluid to a non-Newtonian flow state (block 915). Furthermore, the magnetic field is deactivated to leave the MEMS structure in its latched state at the desired position (block 920).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A mounting system for a micro-electromechanical system (MEMS) structure comprising:
    a MEMS base member;
    a non-Newtonian fluid having a threshold viscosity positioned between the base member and the MEMS structure so as to position the MEMS structure relative to the base member; and
    a MEMS actuator coupled to the MEMS structure and positioned to cause movement of the MEMS structure relative to the MEMS base member by generating a force sufficient to exceed the threshold viscosity of the non-Newtonian fluid when the MEMS actuator is activated.

2. The system of claim 1 wherein the non-Newtonian fluid is coupled to the MEMS structure by fluid tension and has an associated viscosity, when the MEMS actuator is not activated, selected to latch the MEMS structure in a desired position and dampen motion of the MEMS structure.

3. The system of claim 2 wherein the non-Newtonian fluid comprises either a magnetorheological (MR) fluid or an electrorheological (ER) fluid.

4. The system of claim 2 wherein the non-Newtonian fluid comprises a grease.

5. The system of claim 2 wherein the MEMS actuator comprises an electrostatic actuator.

6. The system of claim 2 wherein the MEMS actuator comprises an electromagnetic actuator, the electromagnetic actuator comprising:
    a coil member connected to one of the MEMS structure and the MEMS base member;
    a passive member connected to the other of the MEMS structure and the MEMS base member; and
    wherein the passive member is positioned adjacent the coil member so as to be at least one of attracted to or repelled from the coil member when the coil member is activated by passing an electrical signal therethrough.

7. The system of claim 6 wherein the passive member comprises a magnetic plate connected to the MEMS structure and the coil member comprises a planar coil fabricated on the MEMS base member.

8. The system of claim 1 further comprising:
    a bearing member positioned between the MEMS base member and the MEMS structure that movably couples the MEMS structure to the MEMS base member; and
    wherein the non-Newtonian fluid suspends the MEMS structure relative to the MEMS base member.

9. The system of claim 8 wherein the bearing member pivotally couples the MEMS structure to the base member and wherein the actuator is positioned to cause pivotal movement of the MEMS structure about the bearing member when the actuator is activated.

10. The system of claim 9 wherein the non-Newtonian fluid is located at a position displaced from the bearing member and wherein the actuator is positioned on a same side of the bearing member as the non-Newtonian fluid.

11. The system of claim 10 wherein the actuator is positioned at substantially a same location between the MEMS structure and the base member as the non-Newtonian fluid.

12. The system of claim 11 wherein the non-Newtonian fluid comprises a magnetorheological (MR) fluid and wherein the actuator further comprises an electromagnetic actuator, the electromagnetic actuator comprising:
    a coil member connected to one of the MEMS structure and the MEMS base member; and
    a passive member connected to the other of the MEMS structure and the MEMS base member;
    wherein the passive member is positioned adjacent the coil member so as to be attracted to or repelled from the coil member when the coil member is activated by passing an electrical signal therethrough; and
    wherein the coil member is further configured to generate trim fields that buck a magnetic field extending into the MR fluid so that the MR fluid will convert to a Newtonian flow state and that rotate the MEMS structure about the bearing member when the coil member is activated.

13. The system of claim 12 wherein the passive member comprises a magnetic member that generates the magnetic field extending into the MR fluid.

14. The system of claim 12 further comprising an external magnet positioned adjacent the mounting system that generates the magnetic field extending into the MR fluid.

15. The system of claim 11 further comprising:
an electrical connection to the MEMS structure;
wherein the non-Newtonian fluid comprises a electrorheological (ER) fluid and wherein the actuator further comprises an electromagnetic actuator, the electromagnetic actuator comprising:
a coil member connected to one of the MEMS structure and the MEMS base member; and
a passive member connected to the other of the MEMS structure and the MEMS base member;
wherein the passive member is positioned adjacent the coil member so as to be at least one of attracted to or repelled from the coil member when the coil member is activated by passing an electrical signal including a magnetic field signal, that provides a magnetic field that results in the magnetic member being at least one of attracted to or repelled from the coil member, and an electrical field signal thereto; and
wherein the electrical field signal provides an electrical field between the MEMS structure and the coil member using the electrical connection to the MEMS structure, the electrical field maintaining the non-Newtonian fluid in a non-Newtonian state when the electrical field signal is activated.

16. The system of claim 10 further comprising:
a second non-Newtonian fluid positioned between the base member and the MEMS structure at a second position displaced from the bearing member in a direction opposite from the position of the first non-Newtonian fluid; and
a second actuator positioned on the same side of the bearing member as the second non-Newtonian fluid so as to cause pivotal movement of the MEMS structure about the bearing member by generating a force sufficient to exceed the threshold viscosity of the second non-Newtonian fluid when the second actuator is activated.

17. The system of claim 1 further comprising:
a bearing member positioned between the MEMS base member and the MEMS structure that pivotally couples the MEMS structure to the MEMS base;
wherein the non-Newtonian fluid is located at a substantially same position between the MEMS base member and the MEMS structure as the bearing member;
wherein the non-Newtonian fluid suspends the MEMS structure relative to the MEMS base member; and
wherein the non-Newtonian fluid is coupled to the MEMS structure by fluid tension and has an associated viscosity, when the MEMS actuator is not activated, selected to latch the MEMS structure in a desired position and dampen motion of the MEMS structure.

18. A micro-electromechanical system (MEMS) mirror apparatus comprising:
a MEMS substrate;
a MEMS mirror adjacent the substrate;
a joint positioned between the substrate and the MEMS mirror that pivotally couples the MEMS mirror and the substrate;
a non-Newtonian fluid having a threshold viscosity positioned between the substrate and the MEMS mirror that suspends the MEMS mirror relative to the substrate; and
a MEMS force generator coupled between the substrate and the MEMS mirror at a position displaced from the joint that is configured to generate a force sufficient to overcome the threshold viscosity of the non-Newtonian fluid so as to cause pivotal movement of the MEMS mirror about the joint.

19. The system of claim 18 wherein the non-Newtonian fluid is coupled to the MEMS mirror by fluid tension and has an associated viscosity, when the MEMS force generator is not activated, selected to latch the MEMS mirror in a desired position and dampen motion of the MEMS mirror.

20. The system of claim 19 wherein the non-Newtonian fluid comprises either a magnetorheological (MR) fluid or an electrorheological (ER) fluid.

21. The system of claim 19 wherein the non-Newtonian fluid comprises a grease.

22. The system of claim 19 wherein the MEMS force generator comprises an electromagnetic actuator, the electromagnetic actuator comprising:
a coil member connected to one of the MEMS mirror and the MEMS substrate; and
a passive member connected to the other of the MEMS mirror and the MEMS substrate; and
wherein the passive member is positioned adjacent the coil member so as to be at least one of attracted to or repelled from the coil member when the coil member is activated by passing an electrical signal therethrough.

23. The system of claim 22 wherein the passive member comprises a magnetic plate connected to the MEMS mirror and the coil member comprises a planar coil fabricated on the MEMS substrate.

24. The system of claim 22 wherein the joint comprises a solder bump on the MEMS substrate.

25. The system of claim 22 wherein the electromagnetic actuator and the non-Newtonian fluid are positioned on a same side of the joint.

26. The system of claim 25 wherein the electromagnetic actuator is positioned at substantially a same location between the MEMS mirror and the MEMS substrate as the non-Newtonian fluid.

27. The system of claim 26 wherein the non-Newtonian fluid comprises a magnetorheological (MR) fluid and wherein the coil member is further configured to generate trim fields that buck a magnetic field extending into the MR fluid so that the MR fluid will convert to a Newtonian flow state.

28. The system of claim 27 wherein the passive member comprises a magnetic member that generates the magnetic field extending into the MR fluid.

29. The system of claim 28 further comprising an external magnet positioned adjacent the MEMS substrate that generates the magnetic field extending into the MR fluid.

30. The system of claim 26 wherein the non-Newtonian fluid comprises a electrorheological (ER) fluid, the system further comprising:
an electrical connection to the MEMS mirror;
wherein the electrical signal includes a magnetic field signal, that provides a magnetic field that results in the passive member being at least one of attracted to or repelled from the coil member, and an.electrical field signal; and
wherein the electrical field signal provides an electrical field between the MEMS mirror and the coil member using the electrical connection to the MEMS mirror, the electrical field maintaining the non-Newtonian fluid in a non-Newtonian state when the electrical field signal is activated.

31. The system of claim 19 further comprising:
- a second non-Newtonian fluid positioned between the MEMS substrate and the MEMS mirror at a second position displaced from the joint in a direction opposite from the position of the first non-Newtonian fluid; and
- a second force generator positioned on the same side of the joint as the second non-Newtonian fluid so as to cause pivotal movement of the MEMS mirror about the joint by generating a force sufficient to exceed the threshold viscosity of the second non-Newtonian fluid when the second force generator is activated.

32. The system of claim 19 wherein the MEMS mirror is suspended from the MEMS substrate without the use of suspension springs.

33. The system of claim 19 wherein the joint comprises a solder bump.

34. The system of claim 19 wherein the threshold viscosity of the non-Newtonian fluid is from about 1 centipoise (cP) to about 1000 cP.

35. A method for controlling a position of a MEMS structure suspended from a MEMS substrate by a non-Newtonian fluid for pivotal movement about a joint, the method comprising the steps of:
- activating a MEMS force generator to generate a force in a desired direction and having a magnitude sufficient to overcome a threshold viscosity of the non-Newtonian fluid; and
- deactivating the MEMS force generator when a position of the MEMS structure corresponds to a desired position.

36. The method of claim 35 further comprising the steps of:
- estimating the position of the MEMS structure; and
- determining the desired direction based on the estimated position and the desired position.

37. The method of claim 35 wherein the non-Newtonian fluid comprise a magnetorheological (MR) fluid and wherein the MEMS force generator comprises a magnetic member and a coil member connected to respective ones of the MEMS mirror and the MEMS substrate, wherein the step of activating the MEMS force generator further comprises the step of activating the force generator to generate trim fields from the coil member that buck a magnetic field extending into the non-Newtonian fluid to convert the non-Newtonian fluid to a Newtonian state.

38. The method of claim 35 wherein the non-Newtonian fluid comprise a electrorheological (ER) fluid and wherein the MEMS force generator comprises a passive member and a coil member connected to respective ones of the MEMS structure and the MEMS substrate and positioned substantially at a same location between the MEMS structure and the MEMS substrate as the non-Newtonian fluid, wherein the step of activating the MEMS force generator comprises the steps of:
- deactivating an electrical field between the coil member and the MEMS structure so that the non-Newtonian fluid will convert to a Newtonian flow state;
- activating a magnetic field between the coil member and the passive member to generate the force in the desired direction to pivot the MEMS structure about the joint while the electrical field is deactivated;
- activating the electrical field to return the non-Newtonian fluid to a non-Newtonian flow state after the MEMS structure has pivoted to the desired position; and
- deactivating the magnetic field after the MEMS structure has pivoted to the desired position.

* * * * *